United States Patent
Matsuyama

(10) Patent No.: US 9,881,906 B2
(45) Date of Patent: Jan. 30, 2018

(54) SEMICONDUCTOR MODULE

(71) Applicant: Kabushiki Kaisha Toshiba, Minato-ku, Tokyo (JP)

(72) Inventor: Hiroshi Matsuyama, Nomi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 276 days.

(21) Appl. No.: 14/642,533

(22) Filed: Mar. 9, 2015

(65) Prior Publication Data
US 2016/0057864 A1 Feb. 25, 2016

(30) Foreign Application Priority Data
Aug. 19, 2014 (JP) .................. 2014-166634

(51) Int. Cl.
*H01L 25/07* (2006.01)
*H01L 25/18* (2006.01)
(Continued)

(52) U.S. Cl.
CPC ........ *H01L 25/072* (2013.01); *H01L 23/5384* (2013.01); *H01L 23/5386* (2013.01);
(Continued)

(58) Field of Classification Search
CPC ....... H01L 25/072; H01L 24/49; H01L 24/45; H01L 25/18; H01L 2224/0603;
(Continued)

(56) References Cited

U.S. PATENT DOCUMENTS 5,347,158 A 9/1994 Matsuda et al.
2002/0016017 A1* 2/2002 Sakai ................ H01L 31/075
438/57
(Continued)

FOREIGN PATENT DOCUMENTS

EP 2903149 A1 8/2015
JP H06-69415 A 3/1994
(Continued)

OTHER PUBLICATIONS

Ralf Siemieniec et al., "Avoidance of RF Plasma Extraction Transit-Time Oscillations using 3D EMC Simulation—Chances and Limits", Devices & Systems, pp. 16-22, vol. 153, No. 1, (2006).
(Continued)

*Primary Examiner* — Eric Thomas
*Assistant Examiner* — Michael P McFadden
(74) *Attorney, Agent, or Firm* — White & Case LLP

(57) ABSTRACT

According to one embodiment, a semiconductor module includes: a substrate; a first interconnect layer provided on the substrate; a plurality of first semiconductor elements provided on the first interconnect layer, each of the first semiconductor elements having a first electrode, a second electrode, and a third electrode, and the second electrode being electrically connected to the first interconnect layer; a plurality of first rectifying elements provided on the first interconnect layer, each of the first rectifying elements having a fourth electrode and a fifth electrode, and the fifth electrode being electrically connected to the first interconnect layer; and a second interconnect layer provided on the substrate, and the second interconnect layer being electrically connected to the first electrode and the fourth electrode. The second interconnect layer includes a corrugated surface or the first interconnect layer includes a corrugated surface.

8 Claims, 12 Drawing Sheets

(51) Int. Cl.
*H01L 23/538* (2006.01)
*H01L 23/00* (2006.01)

(52) U.S. Cl.
CPC .............. *H01L 24/49* (2013.01); *H01L 24/45* (2013.01); *H01L 25/18* (2013.01); *H01L 2224/0603* (2013.01); *H01L 2224/45124* (2013.01); *H01L 2224/45144* (2013.01); *H01L 2224/48227* (2013.01); *H01L 2224/49111* (2013.01); *H01L 2224/49113* (2013.01); *H01L 2924/00014* (2013.01)

(58) Field of Classification Search
CPC . H01L 2224/45124; H01L 2224/45144; H01L 2224/48227; H01L 2224/49111; H01L 2224/49113
USPC .......................................................... 361/783
See application file for complete search history.

(56) References Cited

U.S. PATENT DOCUMENTS

| | | | | |
|---|---|---|---|---|
| 2007/0013581 | A1* | 1/2007 | Iijima | G01S 7/032 |
| | | | | 342/175 |
| 2011/0291236 | A1* | 12/2011 | Hayashi | H01L 23/49537 |
| | | | | 257/532 |
| 2014/0367736 | A1* | 12/2014 | Iizuka | H01L 25/072 |
| | | | | 257/133 |
| 2015/0084179 | A1* | 3/2015 | Hatori | H01L 23/36 |
| | | | | 257/706 |
| 2015/0115423 | A1* | 4/2015 | Yamashita | H01L 23/49575 |
| | | | | 257/675 |

FOREIGN PATENT DOCUMENTS

| | | |
|---|---|---|
| JP | H08-126349 A | 5/1996 |
| JP | H09-069602 | 3/1997 |
| JP | 2000-209846 | 7/2000 |
| JP | 2001-102519 A | 4/2001 |
| JP | 2001-326300 A | 11/2001 |
| JP | 2002-141465 | 5/2002 |
| JP | 2005-020868 A | 1/2005 |
| JP | 2006-060986 A | 3/2006 |
| JP | 5164136 | 12/2012 |
| WO | 2014-049807 A1 | 4/2014 |

OTHER PUBLICATIONS

Korean Office Action dated May 2, 2016 in corresponding Korean Patent Application No. 10-2015-0013347, along with English translation.

* cited by examiner

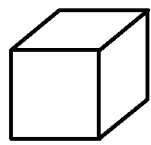
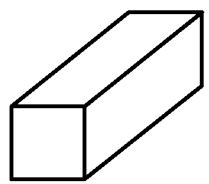
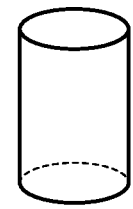
FIG. 12A    FIG. 12B    FIG. 12C
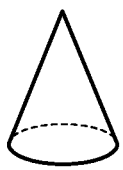
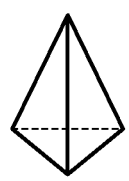
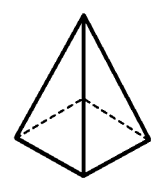
FIG. 12D    FIG. 12E    FIG. 12F
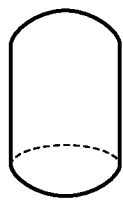
FIG. 12G

SEMICONDUCTOR MODULE

CROSS-REFERENCE TO RELATED APPLICATIONS

This application is based upon and claims the benefit of priority from Japanese Patent Application No. 2014-166634, filed on Aug. 19, 2014; the entire contents of which are incorporated herein by reference.

FIELD

Embodiments described herein relate generally to a semiconductor module.

BACKGROUND

In a semiconductor module, a high breakdown voltage and a high current are realized by connecting an insulated gate bipolar transistor (IGBT) element and a fast recovery diode (FRD) element, which are mounted on a substrate, in parallel.

However, multiple loops of current routes are formed in a circuit by the parallel connection and each loop has an independent resonance frequency. When a resonance frequency of any loop and an oscillation frequency of a noise of an IGBT element are matched, resonance occurs in a semiconductor module and a noise is generated. There is a possibility that the noise generated in the semiconductor module may negatively affect gate control of the IGBT element.

BRIEF DESCRIPTION OF THE DRAWINGS

FIG. 12A to FIG. 12G are schematic oblique views showing parts of semiconductor modules according to a ninth embodiment.

DETAILED DESCRIPTION

Figure 1A:
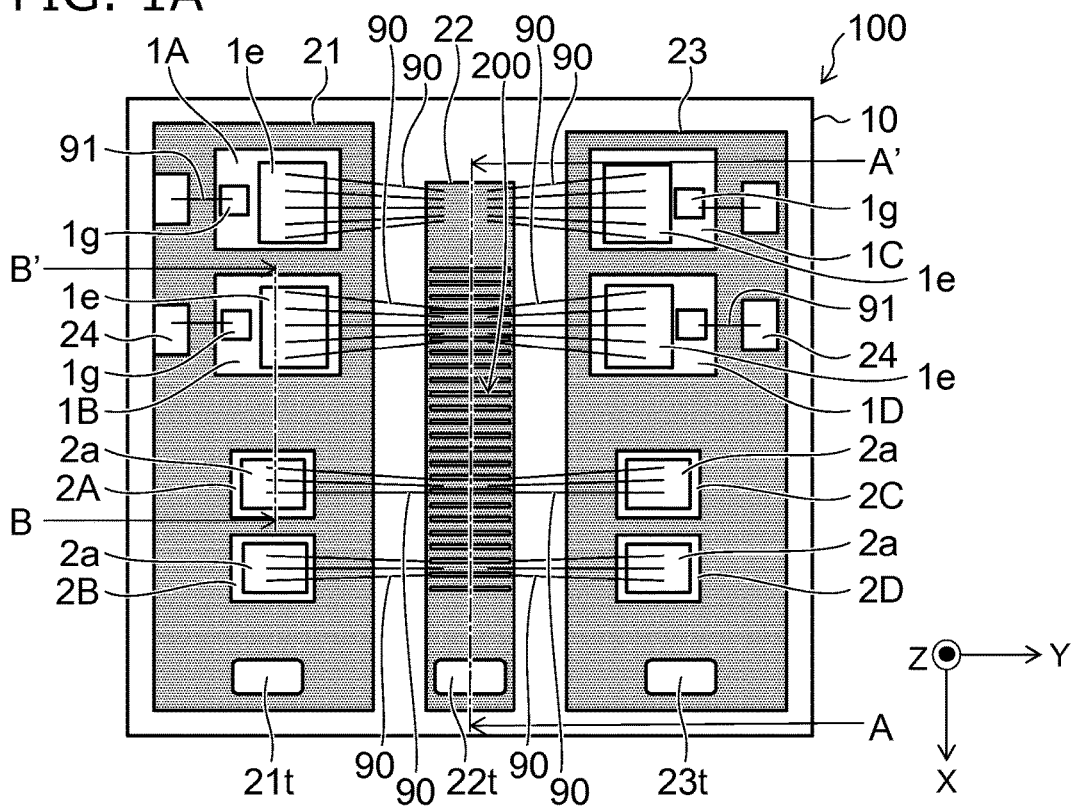
FIG. 1A is a schematic plan view showing a semiconductor module according to a first embodiment and FIGS. 1B and 1C are schematic cross-sectional views showing parts of the semiconductor modules according to the first embodiment.

In general, according to one embodiment, a semiconductor module includes: a substrate; a first interconnect layer provided on the substrate; a plurality of first semiconductor elements provided on the first interconnect layer, each of the first semiconductor elements having a first electrode, a second electrode, and a third electrode, and the second electrode being electrically connected to the first interconnect layer; a plurality of first rectifying elements provided on the first interconnect layer, each of the first rectifying elements having a fourth electrode and a fifth electrode, and the fifth electrode being electrically connected to the first interconnect layer; and a second interconnect layer provided on the substrate, and the second interconnect layer being electrically connected to the first electrode and the fourth electrode. The second interconnect layer includes a corrugated surface on the second interconnect layer or the first interconnect layer includes a corrugated surface on the first interconnect layer.

Hereinafter, embodiments will be described with reference to accompanying drawings. In the following description, the same reference numerals will be given to identical members and the description of members, which have already described, will be appropriately omitted.

First Embodiment

Figure 1B:
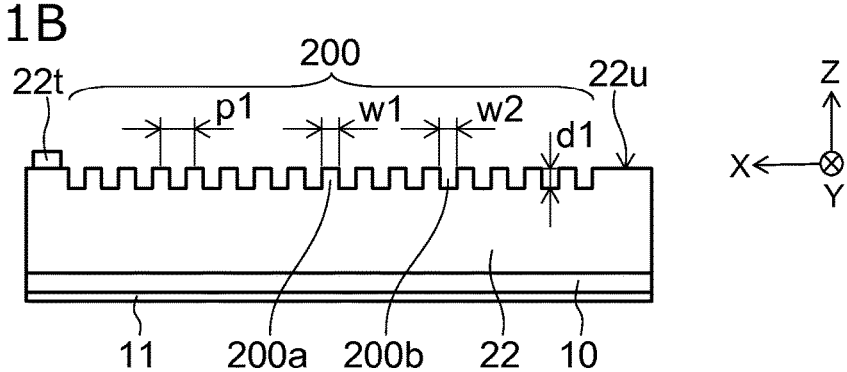
Figure 1C:
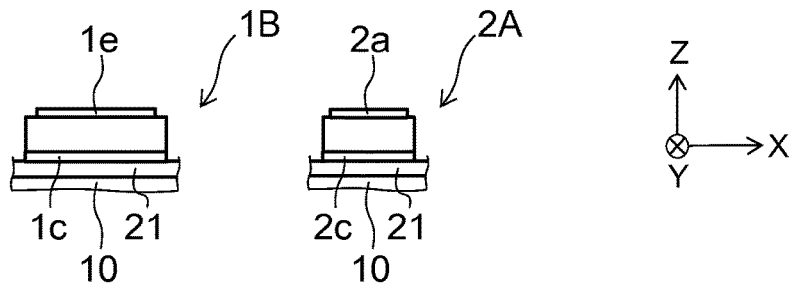

FIG. 1A is a schematic plan view showing a semiconductor module according to a first embodiment and FIGS. 1B and 1C are schematic cross-sectional views showing parts of the semiconductor modules according to the first embodiment.

Herein, a cross section at a position taken along line A-A' of FIG. 1A is shown in FIG. 1B. A cross section at a position taken along line B-B' of FIG. 1A is shown in FIG. 1C. In addition, three-dimensional coordinates are illustrated in the drawings in order to describe an arrangement relationship and dimensions of each member.

A semiconductor module 100 shown in FIGS. 1A to 1C includes a substrate 10, an interconnect layer 21 (first interconnect layer), an interconnect layer 22 (second interconnect layer), an interconnect layer 23 (third interconnect layer), a plurality of semiconductor elements 1A and 1B (first semiconductor elements), a plurality of rectifying elements 2A and 2B (first rectifying elements), a plurality of semiconductor elements 1C and 1D (second semiconductor elements), and a plurality of rectifying elements 2C and 2D (second rectifying elements).

The semiconductor elements 1A to 1D are switching elements such as an IGBT and a metal-oxide-semiconductor field-effect transistor (MOSFET). In the following embodiment, the case including an IGBT is exemplified. The rectifying elements 2A to 2D are reflux diodes such as FRD elements.

In the semiconductor module 100, an interconnect layer 21 is provided on the substrate 10 via a brazing material which is not shown in the drawing. A plurality of semiconductor elements 1A and 1B are provided on the interconnect layer 21. A metal layer 11 is provided under the substrate 10 via an insulating material (not shown) such as a ceramic material.

Each of the plurality of the semiconductor elements 1A and 1B has an emitter electrode 1e (first electrode), a collector electrode 1c (second electrode), and a gate electrode 1g (third electrode). The collector electrode 1c is electrically connected to the interconnect layer 21 via a bonding member (for example, solder) which is not shown in the drawing.

A plurality of rectifying elements 2A and 2B are provided on the interconnect layer 21. Each of the plurality of the rectifying elements 2A and 2B has an anode electrode 2a (fourth electrode) and a cathode electrode 2c (fifth electrode). The cathode electrode 2c is electrically connected to the interconnect layer 21 via a bonding member (for example, solder) which is not shown in the drawing. The cathode electrode 2c is electrically connected to the collector electrode 1c via the interconnect layer 21. The rectifying elements 2A and 2B are connected to the semiconductor elements 1A and 1B in parallel.

In addition, the interconnect layer 23 is provided on the substrate 10 via a brazing material which is not shown in the drawing. A plurality of semiconductor elements 1C and 1D are provided on the interconnect layer 23. Each of the plurality of the semiconductor elements 1C and 1D has an emitter electrode 1e (sixth electrode), a collector electrode 1c (seventh electrode), and a gate electrode 1g (eighth electrode). The collector electrode 1c is electrically connected to the interconnect layer 23 via a bonding member (for example, solder) which is not shown in the drawing.

A plurality of rectifying elements 2C and 2D are provided on the interconnect layer 23. Each of the plurality of the rectifying elements 2C and 2D has an anode electrode 2a (ninth electrode) and a cathode electrode 2c (tenth electrode). The cathode electrode 2c is electrically connected to the interconnect layer 23 via a bonding member (for example, solder) which is not shown in the drawing. The cathode electrode 2c is electrically connected to the collector electrode 1c via the interconnect layer 23. The rectifying elements 2C and 2D are connected to the semiconductor elements 1C and 1D in parallel.

In addition, the interconnect layer 22 is provided on the substrate 10 via a brazing material or the like which is not shown in the drawing. The interconnect layer 22 is electrically connected to the emitter electrodes 1e of the plurality of the semiconductor elements 1A and 1B via wires 90. The interconnect layer 22 is electrically connected to the anode electrodes 2a of the plurality of the rectifying elements 2A and 2B via the wires 90. In addition, the interconnect layer 22 is electrically connected to the emitter electrodes 1e of the plurality of the semiconductor elements 1C and 1D via the wires 90. The interconnect layer 22 is electrically connected to the anode electrodes 2a of the plurality of the rectifying elements 2C and 2D via the wires 90.

The interconnect layers 21 to 23 extend in an X-direction, for example. Each of the interconnect layers 21 to 23 are arranged in a Y-direction. The interconnect layer 21 and the interconnect layer 22 are substantially parallel to each other. The interconnect layer 22 and the interconnect layer 23 are substantially parallel to each other. The interconnect layer 22 is provided between the interconnect layer 21 and the interconnect layer 23 in the Y-direction.

In addition, a gate pad 24 is provided on the substrate 10 via a brazing material or the like which is not shown in the drawing. The gate electrode 1g is electrically connected to the gate pad 24 via a wire 91. In addition, a terminal 21t is provided on the interconnect layer 21. A terminal 22t is provided on the interconnect layer 22. A terminal 23t is provided on the interconnect layer 23. Each member provided on the substrate 10 is sealed with resins such as silicone (not shown).

The substrate 10 includes, for example, ceramics such as aluminum nitride (AlN). The interconnect layers 21 to 23 and the metal layer 11 include, for example, copper (Cu). The wires 90 and 91 include, for example, aluminum (Al) and gold (Au).

In the embodiment, in some cases, the interconnect layers 21 and 23 are called collector patterns and the interconnect layer 22 is called an emitter pattern. In addition, the number of elements provided in the semiconductor module 100 is not limited to the number of those shown in the drawings.

As shown in FIG. 1B, in the semiconductor module 100, a portion of the interconnect layer 22 has a corrugated surface 200 in the cross sectional view. Herein, the surface of the interconnect layer 22 refers to an exposed surface of the interconnect layer 22 other than a portion bonded to the substrate 10. The corrugated surface 200 is formed by, for example, etching, pressing, and cutting.

In the semiconductor module 100, the corrugated surface 200 is provided on an upper surface 22u of the interconnect layer 22. The corrugated surface 200 has a ridge 200a and a groove 200b having substantially geometric shapes. The ridge 200a and the groove 200b are alternated in the X-direction. The corrugated surface 200 exemplified in FIG. 1B has a structure in which the ridge 200a (or groove 200b) is periodically disposed at the same pitch, for example. However, impedance of the interconnect layer 22 in the X-direction may be discontinuous and a corrugated surface 200 may be selectively formed on the interconnect layer 22.

For example, in the case in which the substrate 10 has a size of 50 mm×50 mm, the width of the interconnect layer 22 in the Y-direction is, for example, 3 mm to 20 mm. The length of the interconnect layer 22 in the X-direction is, for example, 10 mm to 50 mm (substrate length). The thickness of the interconnect layer 22 in the Z-direction is, for example, 0.1 mm to 1.5 mm.

In addition, a pitch p1 of the ridge 200a (or groove 200b) in the X-direction is, for example, 0.1 mm to 10 mm. The width w1 of the ridge 200a in the X-direction is, for example, 0.1 mm to 10 mm. The width w2 of the groove 200b in the X-direction is, for example, 0.1 mm to 10 mm. The depth d1 of the groove 200b in the Z-direction is, for example, 0.1 mm to 1.0 mm.

Reference Example

An action of a semiconductor module according to a reference example will be described before describing an action of the first embodiment.

Figure 2A:
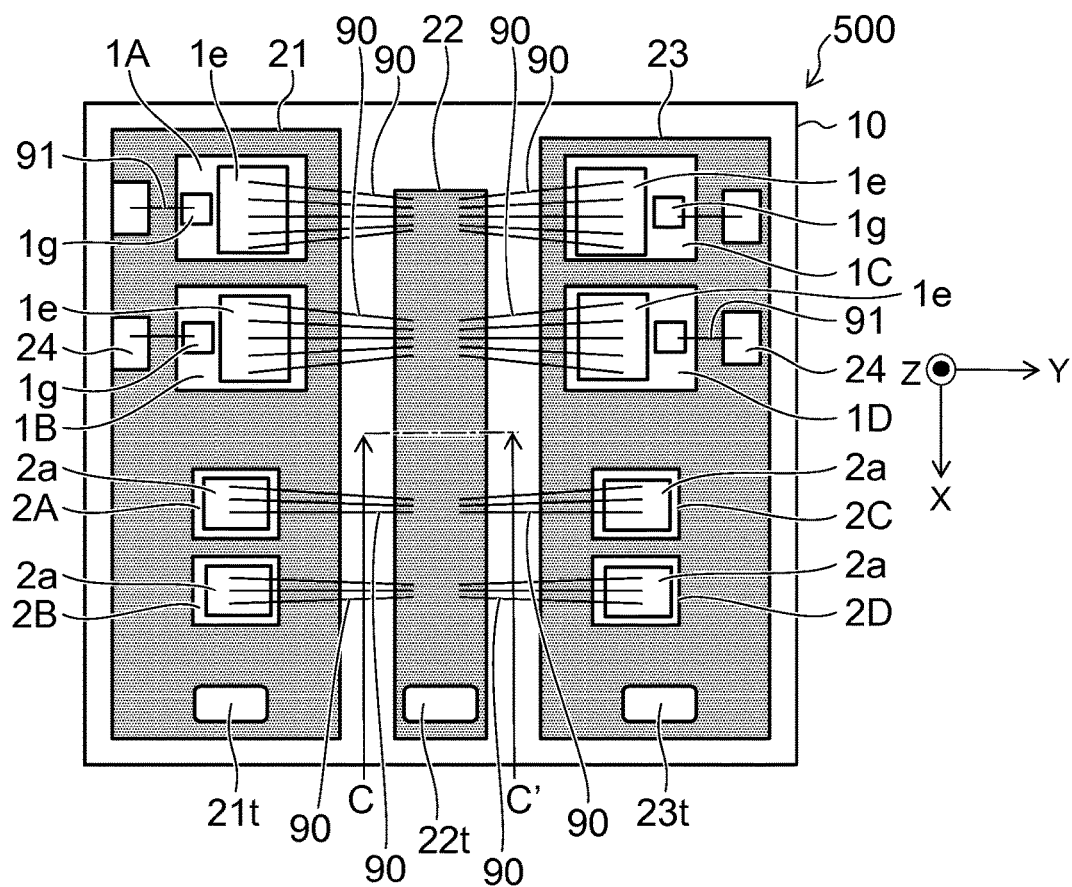
FIG. 2A is a schematic plan view showing the semiconductor module according to a reference example and FIG. 2B is a schematic cross-sectional view showing a part of the semiconductor module according to the reference example.
Figure 2B:
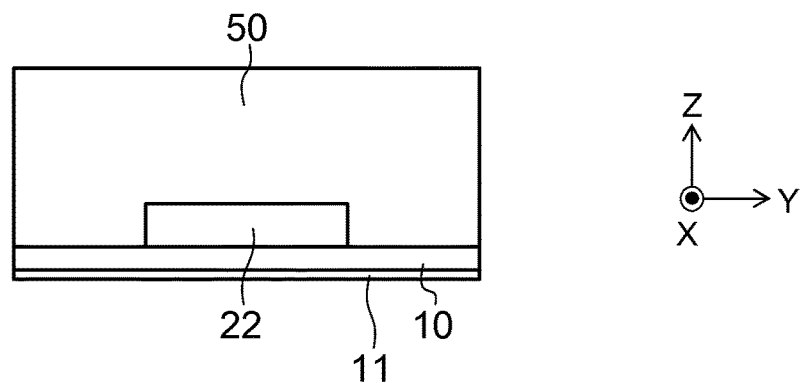

FIG. 2A is a schematic plan view showing the semiconductor module according to the reference example and FIG. 2B is a schematic cross-sectional view showing a part of the semiconductor module according to the reference example.

Herein, a cross section at a position taken along line C-C' of FIG. 2A is shown in FIG. 2B. A sealing resin 50 which protects each member provided on a substrate 10 is shown in FIG. 2B.

The semiconductor module 500 shown in FIG. 2A is not provided with a corrugated surface 200 on an interconnect layer 22.

The substrate 10 shown in FIG. 2B is an insulating layer. A metal layer 11 is provided under the substrate 10. The interconnect layer 22 is provided on the substrate 10. When the substrate 10 is regarded as a dielectric and the metal layer 11 is regarded as a ground layer, the interconnect layer 22 forms a microstrip line.

Figure 3:
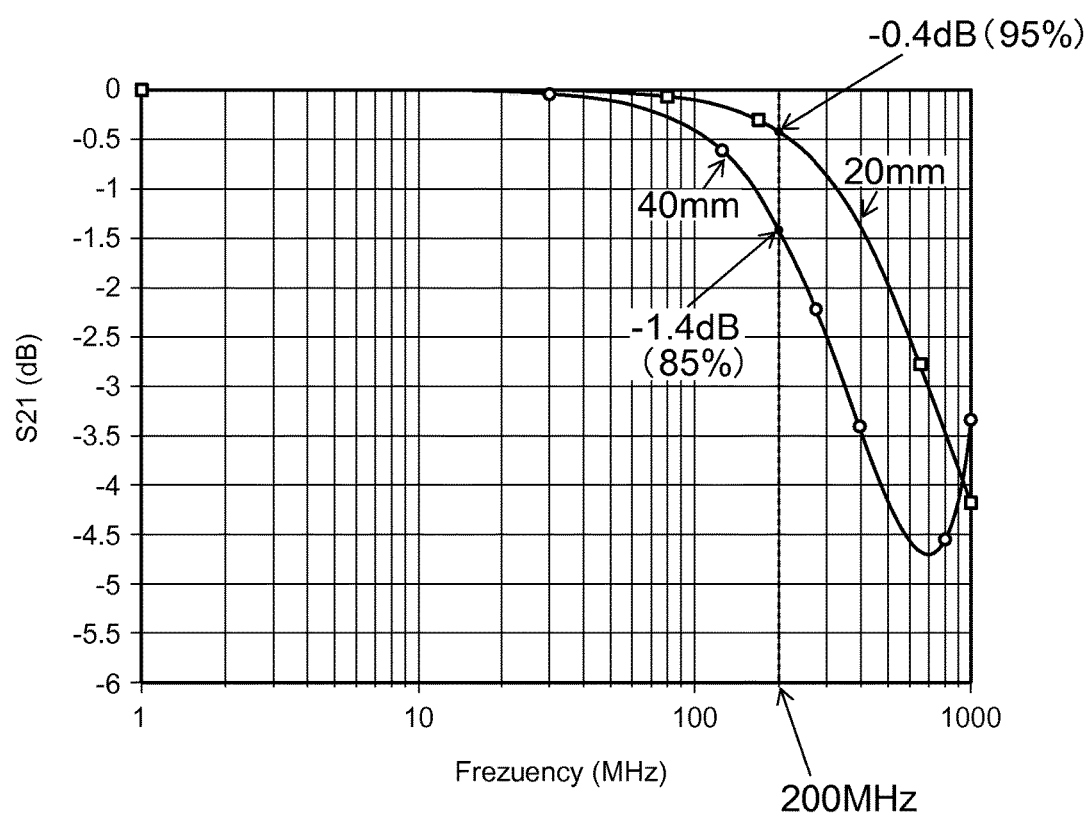
FIG. 3 is a graph showing simulation results of pass characteristics (S21 parameter) of a microstrip line according to the reference example.

FIG. 3 is a graph showing simulation results of pass characteristics (S21 parameter) of the microstrip line according to the reference example.

Herein, the horizontal axis of FIG. 3 is a transmission frequency (MHz) of the microstrip line and the longitudinal axis is an S21 parameter (dB). Simulation results of the cases in which the length of the interconnect layer 22 in the X-direction is 40 mm and 20 mm are shown in FIG. 3.

In the model of the simulation, the substrate 10 includes aluminum nitride (AlN) and the dielectric constant ($\epsilon_r$) thereof is set to 8.6. The thickness of the substrate 10 is 1 mm. The sealing resin 50 includes silicone and the dielectric constant ($\epsilon_r$) thereof is set to 2.7. The thickness of the sealing resin 50 is 10 mm. The width of the interconnect layer 22 in the Y-direction is 6 mm.

As shown in FIG. 3, when a noise at 200 MHz flows through the microstrip line, S21 is attenuated by −0.4 dB (95%) with respect to a length of the interconnect layer 22 of 20 mm. Similarly, S21 is attenuated by −1.4 dB (85%) with respect to a length of the interconnect layer 22 of 40 mm.

In this manner, the longer the length of the interconnect layer is, the more the S21 parameter is attenuated. In addition, it is expected that the attenuation of the S21 parameter will greatly change due to the change in the thickness of the substrate 10 and the change in the width and the thickness of the interconnect layer. Furthermore, the signal or the noise is transmitted through the vicinity of the surface of the microstrip line as the frequency becomes high (skin effect). That is, the results of FIG. 3 indicate that the transmission characteristics of the high frequency noise are greatly changed by changing the microstrip line, that is, the shape (cross section, length, or the like) of the interconnect layer 22.

In addition, in the IGBT, when the gate is turned off, a depletion layer is formed in an $n^-$-type drift region. The depletion layer has a thickness depending on the current applied to the collector side. When the gate of the IGBT is turned on and the current flows from the collector side to the emitter side, holes are injected from a $p^+$-type collector region into the $n^-$-type drift region. When the gate is turned off, the holes are not injected from the $p^+$-type collector region into the $n^-$-type drift region. However, the holes remain in the $n^-$-type drift region.

Next, when the voltage between the collector and the emitter increases through the gate being turned off, the holes remaining in the $n^-$-type drift region are discharged to an emitter electrode. Such a phenomenon indicates that the collector current flows again in accordance with the increase of the voltage between the collector and the emitter. The current is a tail current of the IGBT.

In a period in which the tail current of the IGBT is generated (hereinafter, referred to as a tail period), the holes drive the inside of the depletion layer. Oscillation occurs when the gate is turned off. At this time, the IGBT operates while having negative resistance. That is, the IGBT generates a noise signal. The oscillation frequency of the noise signal of the IGBT when being operated while having the negative resistance is obtained by adding the delay time of the hole injection and the driving time of the holes which is obtained by integrating an inverse number of a drift speed of the holes by the thickness of a space charge layer, and then obtaining an inverse number of the calculated value.

When the calculated oscillation frequency and a parallel resonance frequency of a resonance circuit, which is formed of the interconnect layer or the like in the semiconductor module 500, coincide with each other, the semiconductor module 500 operates as an negative resistance oscillator. When negative resistance oscillation occurs in the semiconductor module 500, there is a possibility that the IGBT may be damaged.

The IGBT generates a noise signal having specified oscillation frequency distribution due to any difference in a chip structure, a size, and a material.

Figure 4A:
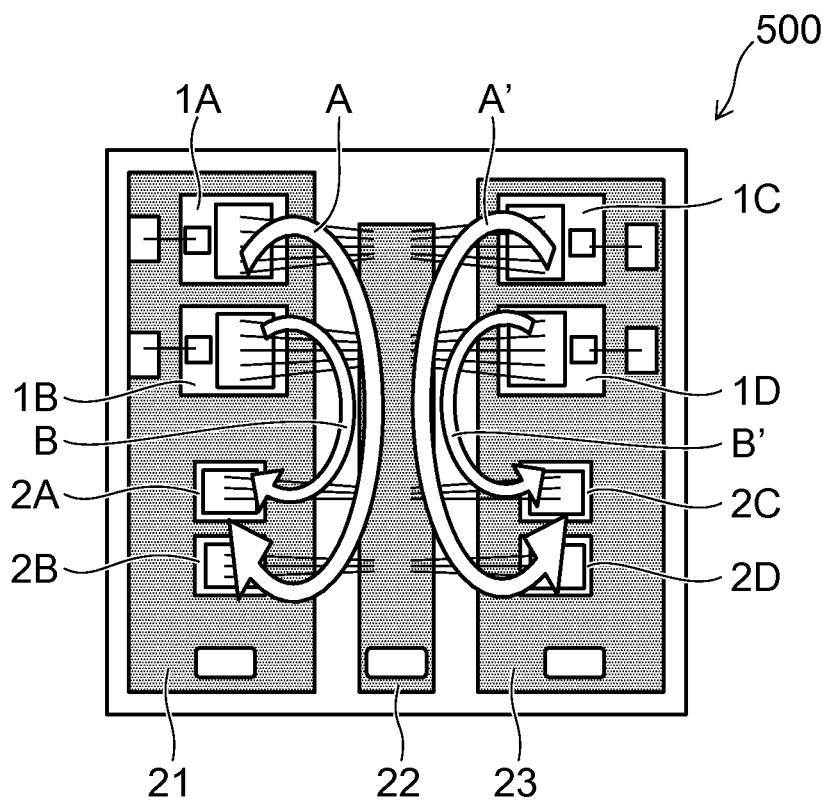
FIG. 4A is a schematic view showing a path of a noise current flowing into the semiconductor module according to the reference example and FIG. 4B is a graph showing a turn-off oscillation of the IGBT according to the reference example.
Figure 4B:
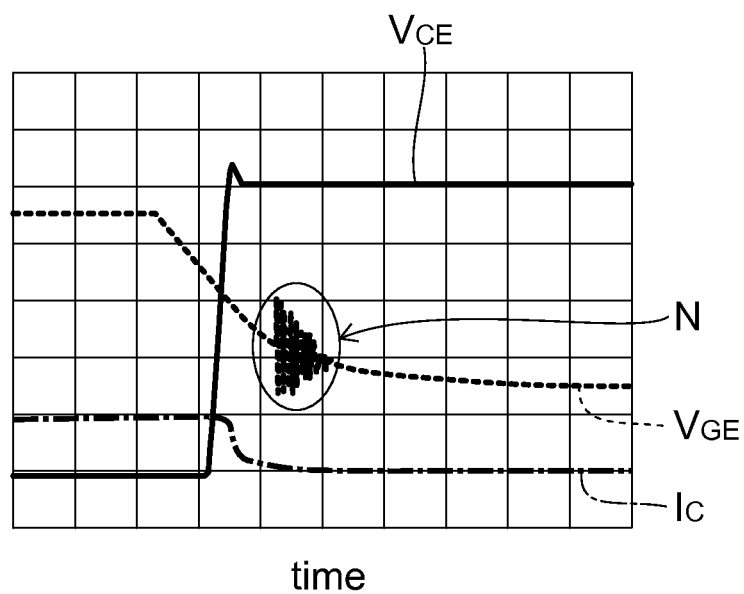

Next, a state when an oscillation frequency of a noise signal of an IGBT and a parallel resonance frequency of a resonance circuit coincide with each other is shown in FIG. 4A and FIG. 4B.

FIG. 4A is a schematic view showing a path of a noise current flowing into the semiconductor module according to the reference example and FIG. 4B is a graph showing a turn-off oscillation of the IGBT according to the reference example.

As shown in FIG. 4A, it is assumed that there are a current A flowing from a semiconductor element 1A to a rectifying element 2B via the interconnect layer 22, a current A' flowing from a semiconductor element 1C to a rectifying element 2D via the interconnect layer 22, a current B flowing from a semiconductor element 1B to a rectifying element 2A via the interconnect layer 22, and a current B' flowing from a semiconductor element 1D to a rectifying element 2C via the interconnect layer 22, as paths of noise currents. All paths are closed loops. All paths pass through the interconnect layer 22 which is interposed between the interconnect layer 21 and interconnect layer 23. In addition, it is assumed that a noise at 100 MHz to 700 MHz is generated from the IGBT in the tail period.

Herein, the resonance of the closed loop (currents A and A') corresponding to a length of the interconnect layer 22 of 40 mm is suppressed. However, in some cases, it is impossible to avoid the resonance of the closed loop (currents B and B') corresponding to a length of the interconnect layer 22 of 20 mm.

For example, when the parallel resonance frequency of the resonance circuit formed of the interconnect layer or the like in the semiconductor module 500 is 200 MHz, in some cases, the noise at a 200 MHz band region is amplified at the closed loop corresponding to a length of the interconnect layer 22 of 20 mm, and the turn-off oscillation shown by an arrow N of FIG. 4B occurs.

Meanwhile, there is a possibility that there may be a plurality of parallel resonance frequencies at 300 MHz and 400 MHz in addition to 200 MHz as parallel resonance frequencies in the module. When the transmission band region of the interconnect layer 22 has an ability to transmit a signal at 500 MHz or more, there is a possibility that resonance may occur at 300 MHz and 400 MHz.

However, it is possible to suppress the resonance of the closed loop by adjusting the size relation between an amplification effect by the resonance and an attenuation effect by the interconnect layer 22. For example, when the magnitude of the attenuation effect by the interconnect layer 22 is larger than that of the amplification effect by the resonance, the semiconductor module is not oscillated.

The action of the first embodiment will be described as follows.

Figure 5A:
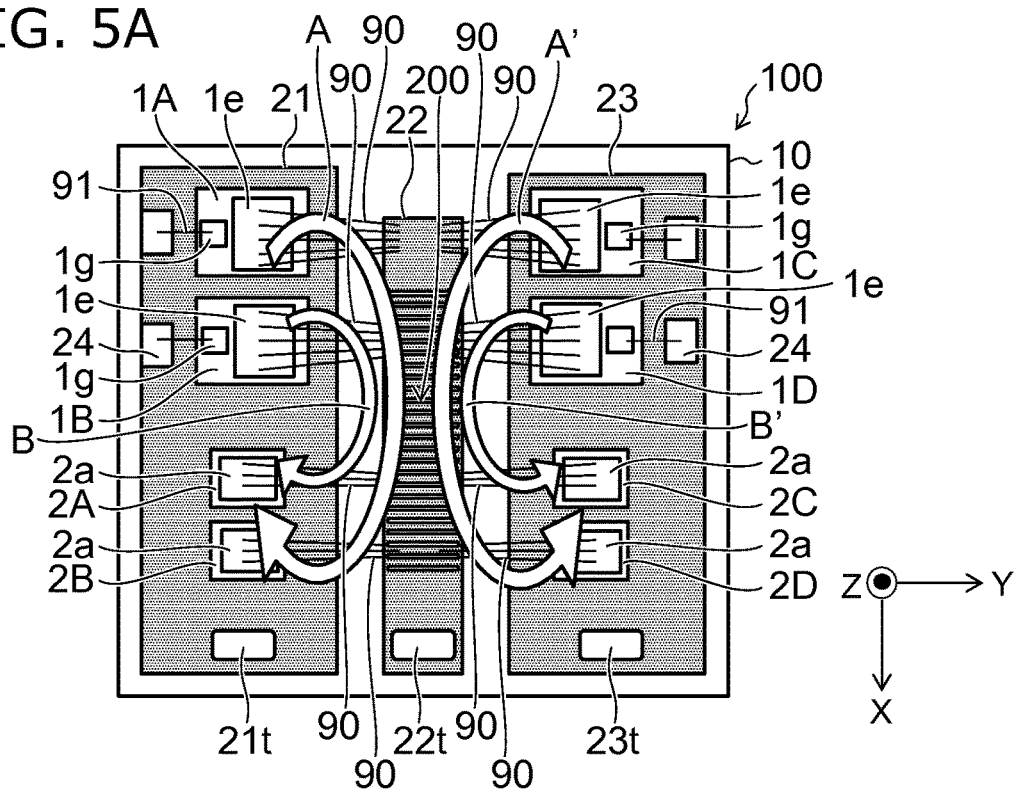
FIG. 5A is a schematic view showing a path of a noise current flowing into the semiconductor module according to the first embodiment and FIG. 5B is a graph showing simulation results of pass characteristics (S21 parameter) of a microstrip line according to the first embodiment.
Figure 5B:
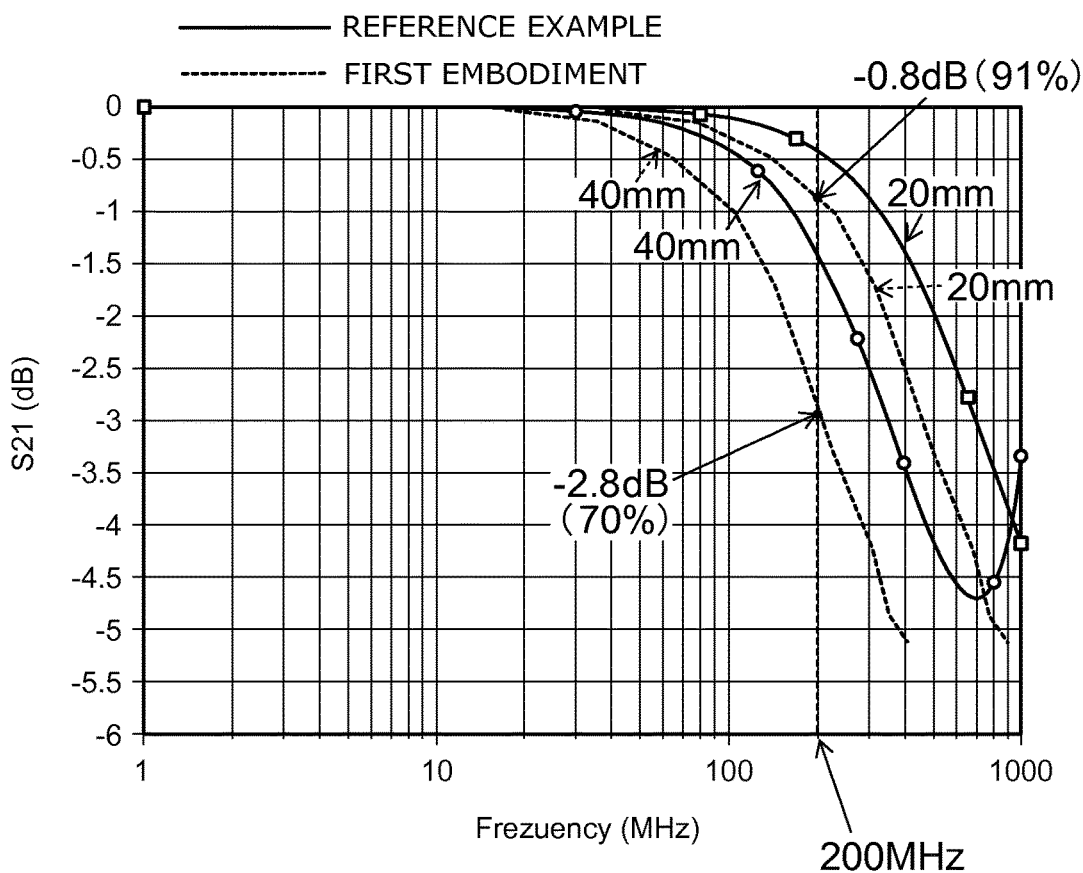

FIG. 5A is a schematic view showing a path of a noise current flowing into the semiconductor module according to the first embodiment and FIG. 5B is a graph showing simulation results of pass characteristics (S21 parameter) of the microstrip line according to the first embodiment.

Herein, the horizontal axis of FIG. 5B is an oscillation frequency (MHz) of a noise signal of the IGBT and the longitudinal axis is an S21 parameter (dB). Simulation results of the cases in which the lengths of the interconnect layer 22 in the X-direction are 40 mm and 20 mm are shown in FIG. 5B. In addition, the results of the reference example are also shown in FIG. 5B.

As shown in FIG. 5A, a current A, a current A, a current B, and a current B' are exemplified as paths of noise currents. The corrugated surface 200 is provided on the interconnect layer 22 of the semiconductor module 100.

In the model of the simulation, the substrate 10 includes aluminum nitride (AlN) and the dielectric constant ($\in_r$) thereof is set to 8.6. The thickness of the substrate 10 is 1 mm. The sealing resin 50 includes silicone and the dielectric constant ($\in_r$) thereof is set to 2.7. The thickness of the sealing resin 50 is 10 mm. The width of the interconnect layer 22 in the Y-direction is 6 mm. Furthermore, the corrugated surface 200 is provided in the model.

As shown in FIG. 5B, at the oscillation frequency of a noise of 200 MHz, when the length of the interconnect layer 22 is 20 mm, the attenuation of the S21 parameter is −0.8 dB (91%). In addition, at the oscillation frequency of 200 MHz, when the length of the interconnect layer 22 is 40 mm, the attenuation of the S21 parameter is −2.8 dB (70%).

In the simulation results of the first embodiment, the S21 parameter curves are more attenuated compared to those of the reference example. That is, it can be seen that when the corrugated surface 200 is provided on the interconnect layer 22, the S21 parameter is relatively attenuated as compared to that of the reference example.

This is because the signal or the noise passes through the skin portion of the interconnect layer 22 rather than the inside of the interconnect as the frequency becomes higher. In the first embodiment, the corrugated surface 200 is provided on the interconnect layer 22, and thus, the S21 parameter on the high frequency side is efficiently attenuated.

Accordingly, the coincidence between the oscillation frequency of the noise signal of the IGBT and the parallel resonance frequency of the resonance circuit in the semiconductor module rarely occurs. As a result, the oscillation of the noise in the semiconductor module 100 is suppressed, and thus, the IGBT is rarely damaged.

In addition, even if the corrugated surface 200 is provided on the interconnect layer 22, the resistance of the interconnect layer 22 is not substantially changed. Accordingly, the emitter current of the IGBT flows through the inside of the interconnect layer 22 without loss.

Second Embodiment

Figure 6A:
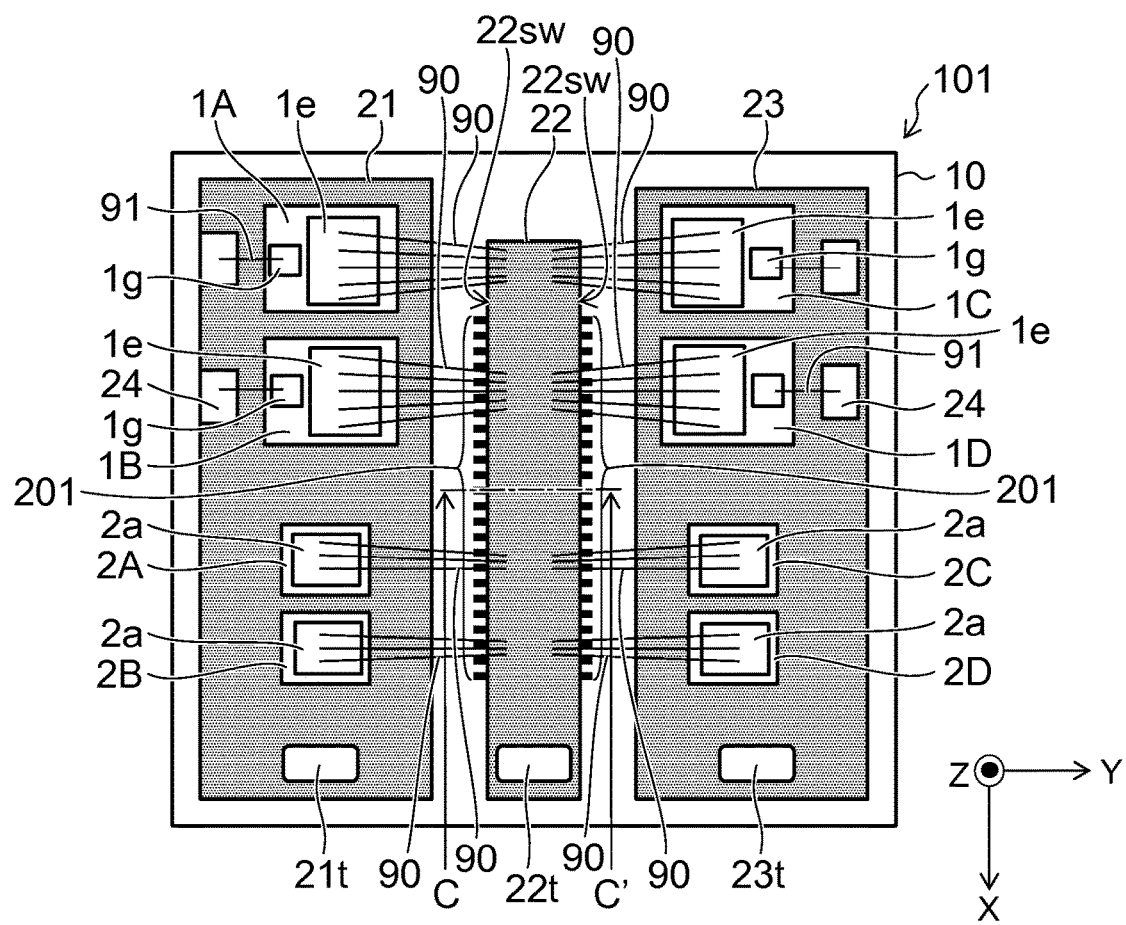
FIG. 6A is a schematic plan view showing a semiconductor module according to a second embodiment and FIG. 6B is a schematic cross-sectional view showing a part of the semiconductor module according to the second embodiment.
Figure 6B:
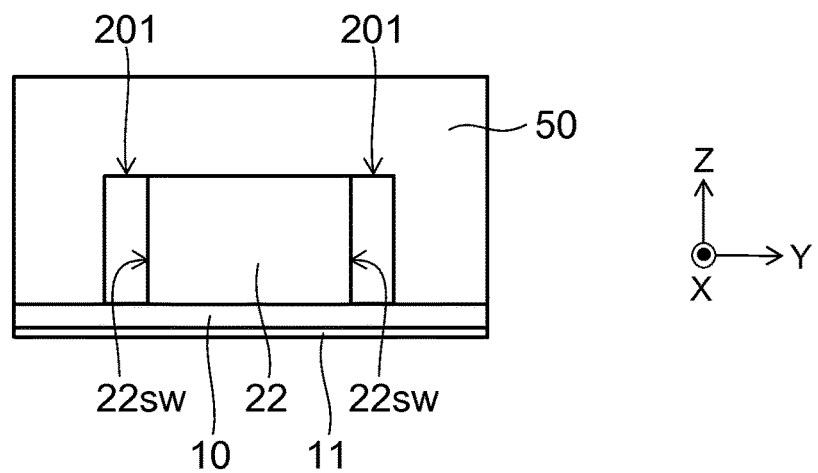

FIG. 6A is a schematic plan view showing a semiconductor module according to a second embodiment and FIG. 6B is a schematic cross-sectional view showing a part of the semiconductor module according to the second embodiment.

Herein, a cross section at a position taken along line C-C' of FIG. 6A is shown in FIG. 6B.

In the semiconductor module 101 according to the second embodiment, a corrugated surface 201 is provided on a side surface 22sw of an interconnect layer 22. In some cases, a noise current is biased to the side surface of the interconnect layer 22, for example. In such a case, it is possible to efficiently attenuate an S21 parameter using the corrugated surface 201.

Third Embodiment

Figure 7A:
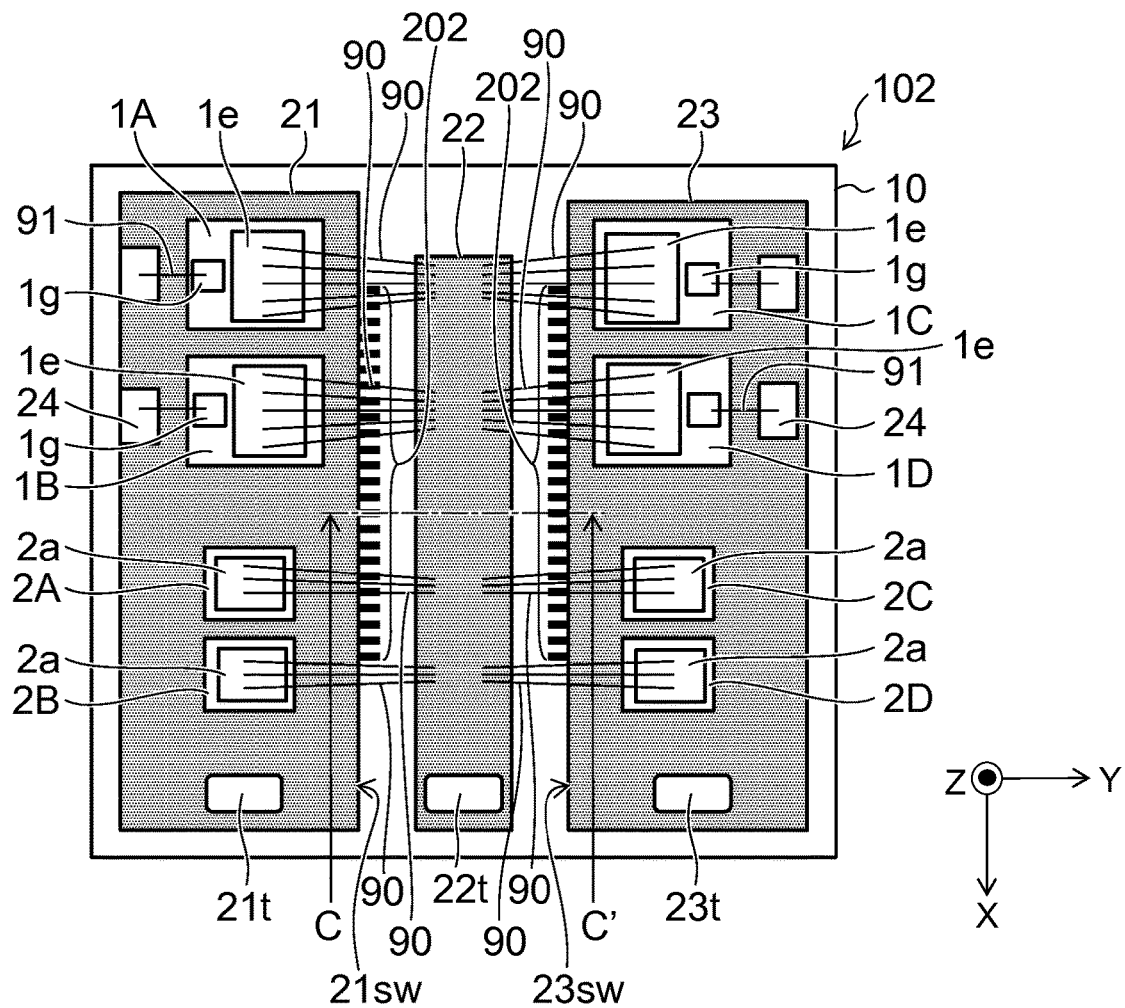
FIG. 7A is a schematic plan view showing a semiconductor module according to a third embodiment and FIG. 7B is a schematic cross-sectional view showing a part of the semiconductor module according to the third embodiment.
Figure 7B:
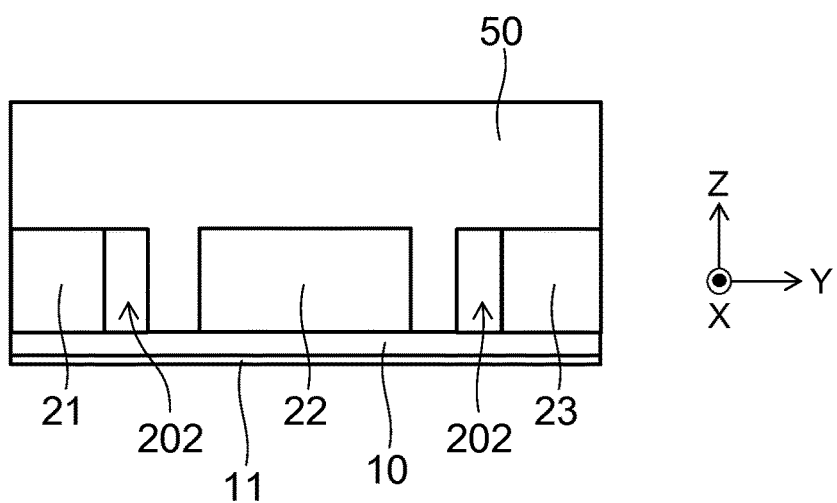

FIG. 7A is a schematic plan view showing a semiconductor module according to a third embodiment and FIG. 7B is a schematic cross-sectional view showing a part of the semiconductor module according to the third embodiment.

Herein, a cross section at a position taken along line C-C' of FIG. 7A is shown in FIG. 7B.

In a semiconductor module 102 according to the third embodiment, a corrugated surface 202 is provided on a surface of an interconnect layer 21 or a surface of an interconnect layer 23. For example, a corrugated surface 202 is provided on a side surface 21sw of the interconnect layer 21. In addition, the corrugated surface 202 is provided on a side surface 23sw of the interconnect layer 23.

In the semiconductor module 102, a grounded coplanar line is formed of the interconnect layer 21 and the interconnect layer 23, which are provided on a substrate 10, and the interconnect layer 22, which is provided on the substrate 10 and is interposed between the interconnect layer 21 and the interconnect layer 23.

Herein, the difference between the impedance of the interconnect layer 21 and the impedance of the interconnect layer 22 becomes great by providing the corrugated surface 202 on the side surface 21sw of the interconnect layer 21. In addition, the difference between the impedance of the interconnect layer 23 and the impedance of the interconnect layer 22 becomes great by providing the corrugated surface 202 on the side surface 23sw of the interconnect layer 23.

Accordingly, the noise signal of the IGBT is rarely transmitted from the interconnect layer 21 to the interconnect layer 22 and the noise signal of the IGBT is rarely transmitted from the interconnect layer 23 to the interconnect layer 22. Accordingly, the noise signal of the IGBT is efficiently attenuated and the coincidence between the oscillation frequency of the noise signal of the IGBT and the parallel resonance frequency of the resonance circuit in the semiconductor module rarely occurs.

Fourth Embodiment

Figure 8A:
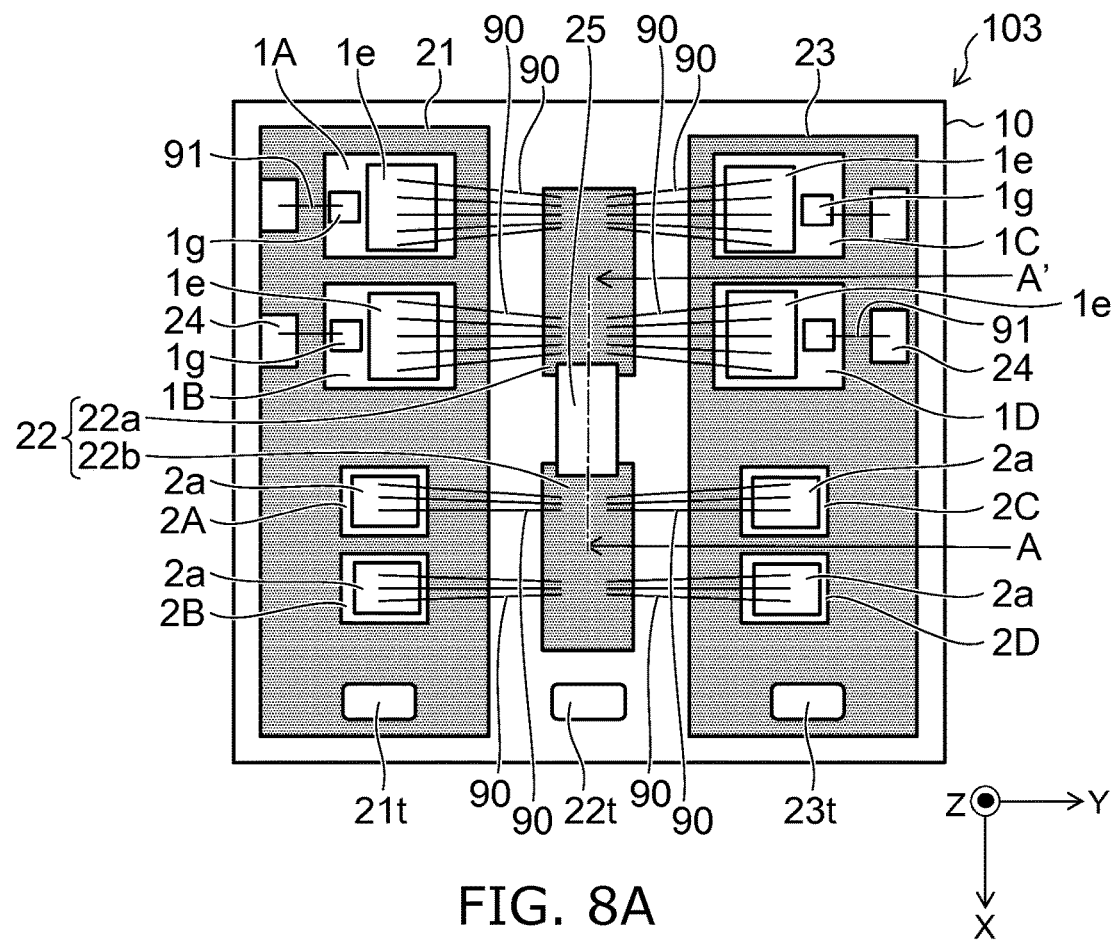
FIG. 8A is a schematic plan view showing a semiconductor module according to a fourth embodiment and FIG. 8B is a schematic cross-sectional view showing a part of the semiconductor module according to the fourth embodiment.
Figure 8B:
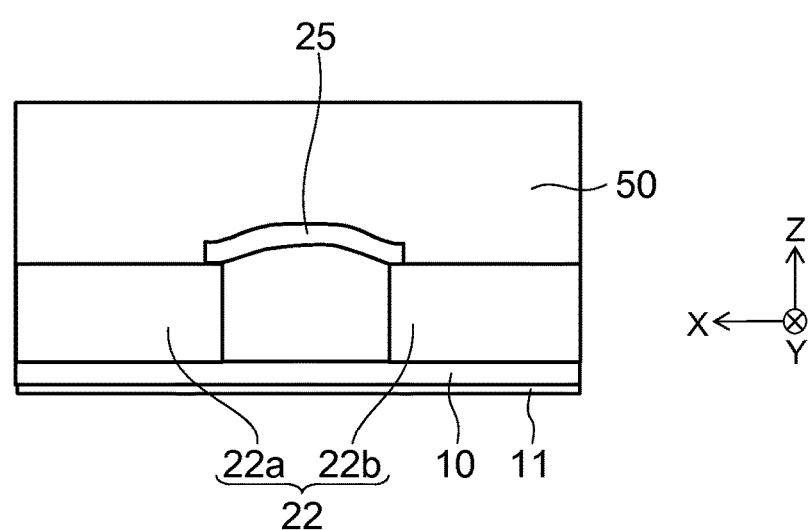

FIG. 8A is a schematic plan view showing a semiconductor module according to a fourth embodiment and FIG. 8B is a schematic cross-sectional view showing a part of the semiconductor module according to the fourth embodiment.

Herein, a cross section at a position taken along line A-A' of FIG. 8A is shown in FIG. 8B.

In a semiconductor module 103 according to the fourth embodiment, an interconnect layer 22 provided on a substrate 10 is divided into a first portion 22a and a second portion 22b. That is, the interconnect layer 22 has the first portion 22a and the second portion 22b.

Herein, the first portion 22a is electrically connected to emitter electrodes 1e of a plurality of semiconductor elements 1A to 1D via wires 90. The second portion 22b is electrically connected to anode electrodes 2a of a plurality of rectifying elements 2A and 2B via the wires 90. The first portion 22a and the second portion 22b are electrically connected to each other via a connection member 25. The connection member 25 is, for example, a plate or a wire.

The impedance of the connection member 25 is different from the impedance of the interconnect layer 22. For example, the connection member 25 includes any of the metal materials such as aluminum (Al), nickel (Ni), gold (Au), silver (Ag), titanium (Ti), and iron (Fe), or alloy materials such as copper alloy made of SnCu or Kovar materials made of FeNiCo.

Reflection of a noise signal easily occurs between the first portion 22a and the connection member 25 and between the second portion 22b and the connection member 25 by connecting the first portion 22a of the interconnect layer 22 and the second portion 22b of the interconnect layer 22 using the connection member 25. Accordingly, the coincidence between the oscillation frequency of the noise signal of the IGBT and the parallel resonance frequency of the resonance circuit in the semiconductor module rarely occurs.

Fifth Embodiment

Figure 9A:
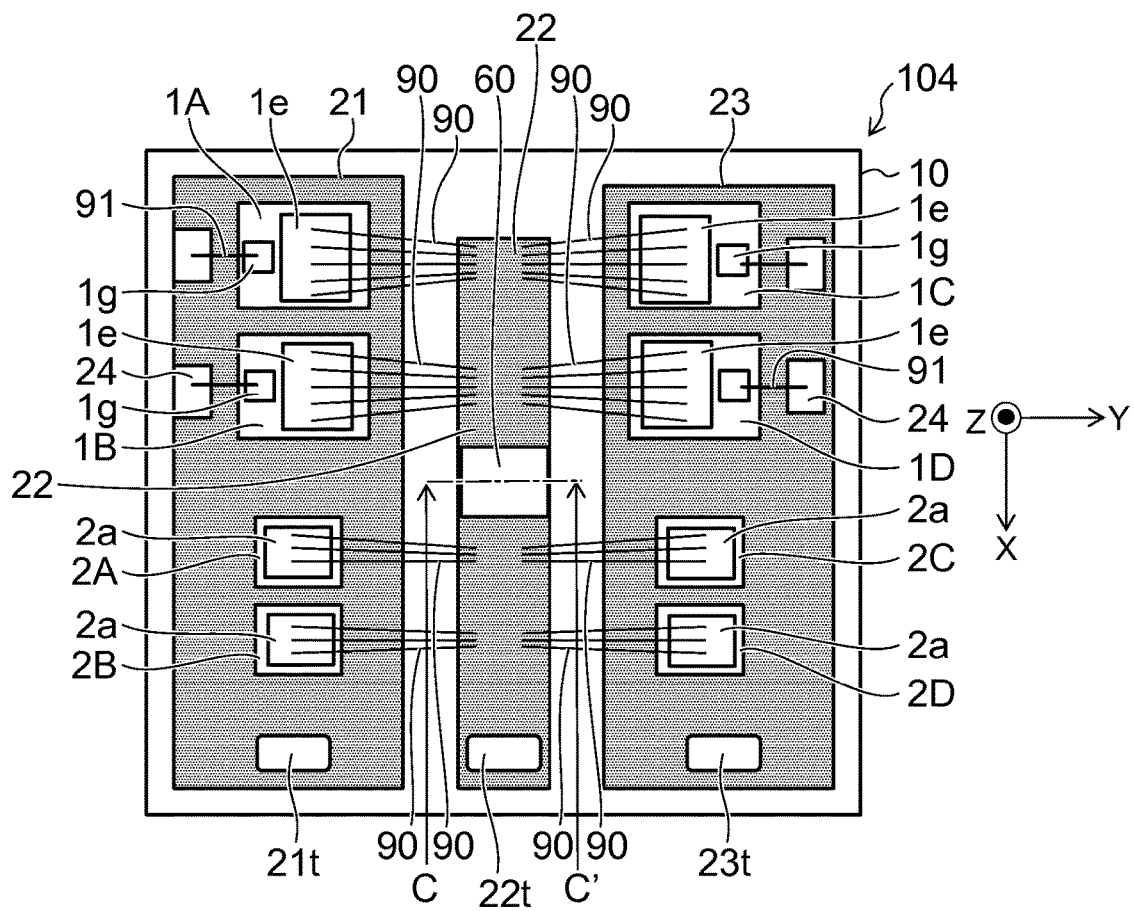
FIG. 9A is a schematic plan view showing a semiconductor module according to a fifth embodiment and FIG. 9B is a schematic cross-sectional view showing a part of the semiconductor module according to the fifth embodiment.
Figure 9B:
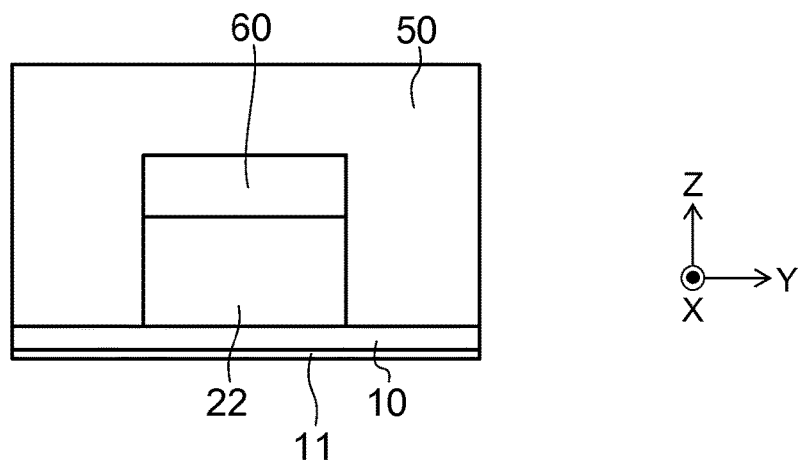

FIG. 9A is a schematic plan view showing a semiconductor module according to a fifth embodiment and FIG. 9B is a schematic cross-sectional view showing a part of the semiconductor module according to the fifth embodiment.

Herein, a cross section at a position taken along line C-C' of FIG. 9A is shown in FIG. 9B.

In a semiconductor module 104 according to the fifth embodiment, a wave absorber 60 is provided on an interconnect layer 22. The wave absorber 60 is, for example, a magnetic body such as ferrite. The wave absorber 60 may have a block shape or a sheet shape.

A noise signal is absorbed by the wave absorber 60 by providing the wave absorber 60 on the interconnect layer 22. That is, the noise signal is attenuated. Accordingly, the coincidence between the oscillation frequency of the noise signal of the IGBT and the parallel resonance frequency of the resonance circuit in the semiconductor module rarely occurs.

Sixth Embodiment

Figure 10:
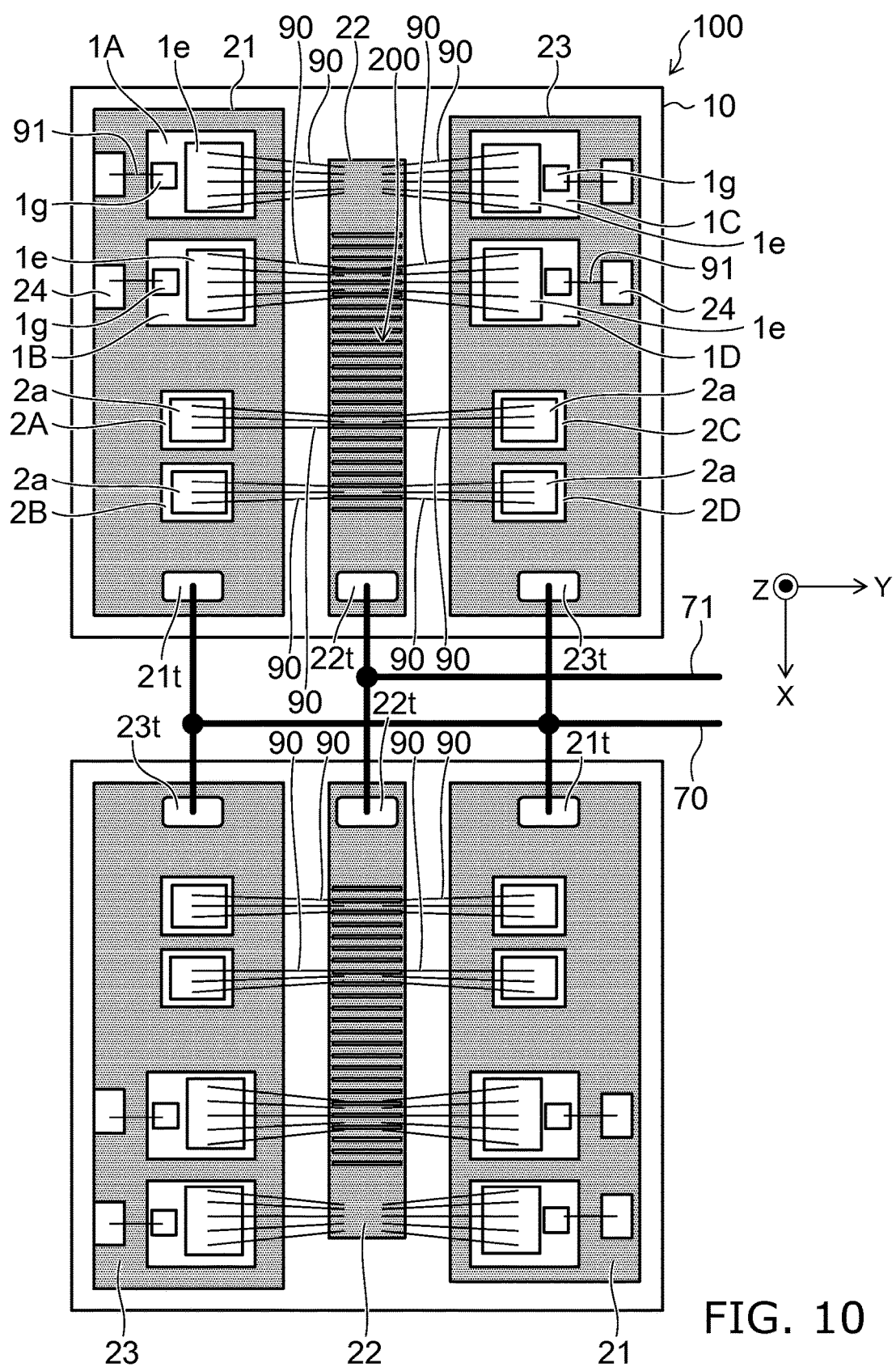
FIG. 10 is a schematic plan view showing a semiconductor module according to a sixth embodiment.

FIG. 10 is a schematic plan view showing a semiconductor module according to a sixth embodiment.

The semiconductor module 100 is exemplified in FIG. 10 as an example, but any of the semiconductor modules 101 to 104 may be applied thereto.

The semiconductor module shown in FIG. 10 has a pair of semiconductor modules 100. Each of the pair of the semiconductor modules is arranged in an X-direction.

Interconnect layers 21 of the pair of semiconductor module 100 are electrically connected to each other via a terminal 21t through a collector wire (first wire) 70. In addition, interconnect layers 23 of the pair of semiconductor modules 100 are electrically connected to each other via a terminal 23t through the collector wire 70. Furthermore, interconnect layers 22 of the pair of semiconductor modules 100 are electrically connected to an emitter wire (second wire) 71 via a terminal 22t.

Accordingly, also in such a pair of the semiconductor modules 100, the coincidence between the oscillation frequency of the noise signal of the IGBT and the parallel resonance frequency of the resonance circuit in the semiconductor module rarely occurs.

Seventh Embodiment

Figure 11A:
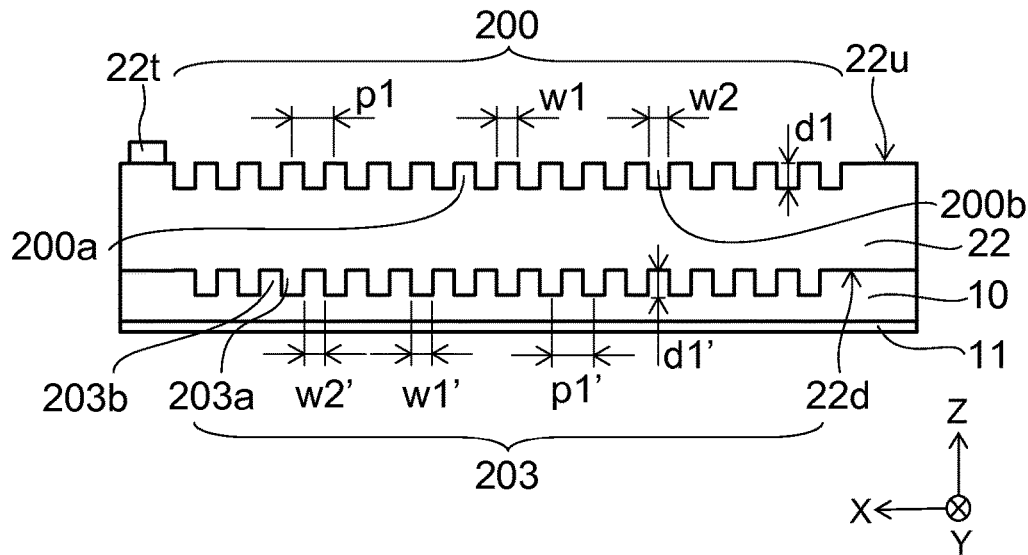
FIG. 11A is a schematic cross-sectional view showing a part of a semiconductor module according to a seventh embodiment and FIG. 11B and FIG. 11C are schematic plan views showing parts of semiconductor modules according to an eighth embodiment.

FIG. 11A is a schematic cross-sectional view showing a part of a semiconductor module according to a seventh embodiment.

As shown in FIG. 11A, a corrugated surface 203 may be provided on a rear surface 22d of the interconnect layer 22. The interconnect layer 22 includes the corrugated surface 203. The rear surface of the interconnect layer 22 refers to the portion bonded to the substrate 10.

The corrugated surface 203 has a ridge 203a and a groove 203b. The corrugated surface 203 has a structure in which the ridge 203a (or groove 203b) is periodically disposed at the same pitch, for example. However, impedance of the interconnect layer 22 in the X-direction may be discontinuous and the corrugated surface 203 may be selectively formed on the interconnect layer 22.

For example, a pitch p1' of the ridge 203a (or groove 203b) in the X-direction is, for example, 0.1 mm to 10 mm. The width w1' of the ridge 203a in the X-direction is, for example, 0.1 mm to 10 mm. The width w2' of the groove 203b in the X-direction is, for example, 0.1 mm to 10 mm. The depth d1' of the groove 203b in the Z-direction is, for example, 0.1 mm to 1.0 mm.

Eighth Embodiment

Figure 11B:
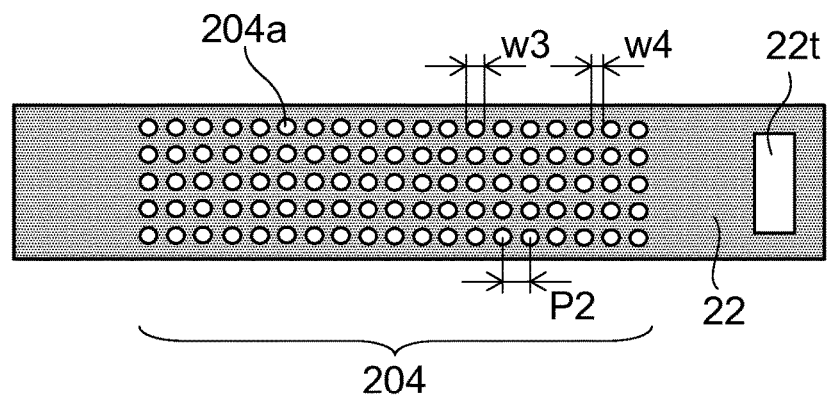
Figure 11C:
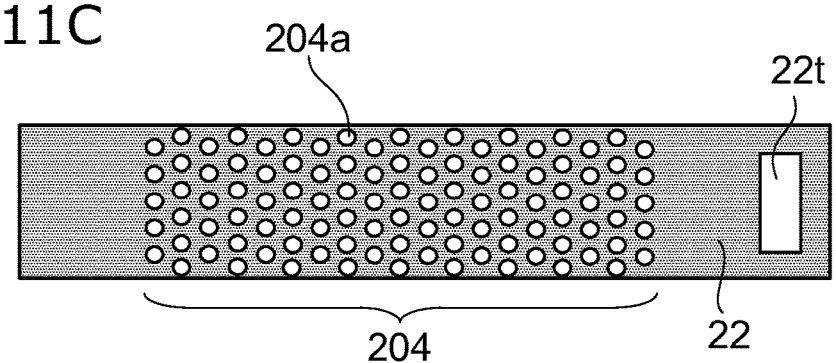

FIG. 11B and FIG. 11C are schematic plan views showing parts of semiconductor modules according to an eighth embodiment.

As shown in FIG. 11B, ridges 204a in a corrugated surface 204 may be provided on a grid. The interconnect layer 22 includes the corrugated surface 204.

The corrugated surface 204 has a structure in which the ridge 204a is periodically disposed at the same pitch, for example. However, impedance of the interconnect layer 22 in the X-direction may be discontinuous and the corrugated surface 204 may be selectively formed on the interconnect layer 22.

For example, a pitch p2 of the ridge 204a in the X or Y-direction is, for example, 0.1 mm to 10 mm. The width w3 of the ridge 204a in the X-direction is, for example, 0.1 mm to 10 mm. The height of the ridge 204a in the Z-direction is, for example, 0.1 mm to 1.0 mm.

Furthermore, as shown in FIG. 11C, ridges 204a in a corrugated surface 204 may be provided in zigzag.

Ninth Embodiment

FIG. 12A to FIG. 12G are schematic oblique views showing parts of semiconductor modules according to a ninth embodiment.

As shown in FIG. 12A to FIG. 12G, a ridge may be each of a cube (FIG. 12A), a cuboid (FIG. 12B), a column (FIG. 12C), a cone (FIG. 12D), a trigonal pyramid (FIG. 12E), a quadrangular pyramid (FIG. 12F), and a column rounded at a top end (FIG. 12G).

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor module comprising:
   a substrate;
   a first interconnect layer provided on the substrate;
   a plurality of first semiconductor elements provided on the first interconnect layer, each of the first semiconductor elements having a first electrode, a second electrode, and a third electrode, and the second electrode being electrically connected to the first interconnect layer;
   a plurality of first rectifying elements provided on the first interconnect layer, each of the first rectifying elements having a fourth electrode and a fifth electrode, and the fifth electrode being electrically connected to the first interconnect layer;
   a second interconnect layer provided on the substrate, and the second interconnect layer being electrically connected to the first electrode and the fourth electrode,
   the second interconnect layer including a corrugated surface on the second interconnect layer or the first interconnect layer including a corrugated surface on the first interconnect layer; and
   the second interconnect layer including the corrugated surface on a side surface of the second interconnect layer.

2. A semiconductor module comprising:
   a substrate having uniform thickness;
   a first interconnect layer provided on the substrate;
   a plurality of first semiconductor elements provided on the first interconnect layer, each of the first semiconductor elements having a first electrode, a second electrode, and a third electrode, and the second electrode being electrically connected to the first interconnect layer;
   a plurality of first rectifying elements provided on the first interconnect layer, each of the first rectifying elements having a fourth electrode and a fifth electrode, and the fifth electrode being electrically connected to the first interconnect layer; and
   a second interconnect layer provided on the substrate, and the second interconnect layer being electrically connected to the first electrode and the fourth electrode,
   the second interconnect layer including a corrugated surface on the second interconnect layer or the first interconnect layer including a corrugated surface on the first interconnect layer,
   the first interconnect layer includes the corrugated surface on a side surface of the first interconnect layer.

3. A semiconductor module comprising:
   a substrate having uniform thickness;
   a first interconnect layer provided on the substrate;
   a plurality of first semiconductor elements provided on the first interconnect layer, each of the first semiconductor elements having a first electrode, a second electrode, and a third electrode, and the second electrode being electrically connected to the first interconnect layer;
   a plurality of first rectifying elements provided on the first interconnect layer, each of the first rectifying elements having a fourth electrode and a fifth electrode, and the fifth electrode being electrically connected to the first interconnect layer;
   a second interconnect layer provided on the substrate, and the second interconnect layer being electrically connected to the first electrode and the fourth electrode,
   the second interconnect layer including a corrugated surface on the second interconnect layer or the first interconnect layer including a corrugated surface on the first interconnect layer;
   a third interconnect layer provided on the substrate, the third interconnect layer includes a corrugated surface on a side surface of the third interconnect layer;
   a plurality of second semiconductor elements provided on the third interconnect layer, each of the second semiconductor elements having a sixth electrode, a seventh electrode, and an eighth electrode, and the seventh electrode being electrically connected to the third interconnect layer; and
   a plurality of second rectifying elements provided on the third interconnect layer, each of the second rectifying elements having a ninth electrode and a tenth electrode, and the tenth electrode being electrically connected to the third interconnect layer,
   the sixth electrode and the ninth electrode being electrically connected to the second interconnect layer.

4. A semiconductor module comprising:
   a substrate;
   a first interconnect layer provided on the substrate;
   a plurality of first semiconductor elements provided on the first interconnect layer, each of first semiconductor elements having a first electrode, a second electrode, and a third electrode, and the second electrode being electrically connected to the first interconnect layer;
   a plurality of first rectifying elements provided on the first interconnect layer, each of first rectifying elements having a fourth electrode and a fifth electrode, the fifth electrode being electrically connected to the first interconnect layer; and
   a second interconnect layer provided on the substrate, second interconnect layer having a first portion and a second portion, the first portion being electrically connected to the first electrode, the second portion being electrically connected to the fourth electrode, and the first portion and the second portion being electrically connected to each other via a connection member.

5. The module according to claim 4, wherein
   the impedance of the connection member is different from the impedance of the first portion and the second portion.

6. The module according to claim 4, wherein
   the connection member is a plate or a wire.

7. The module according to claim 4, further comprising:
   a third interconnect layer provided on the substrate;

a plurality of second semiconductor elements provided on the third interconnect layer, each of the second semiconductor elements having a sixth electrode, a seventh electrode, and an eighth electrode, and the seventh electrode being electrically connected to the third interconnect layer; and a plurality of second rectifying elements provided on the third interconnect layer, each of the second rectifying elements having a ninth electrode and a tenth electrode, and the tenth electrode being electrically connected to the third interconnect layer, the sixth electrode and the ninth electrode being electrically connected to the second interconnect layer.

8. The module according to claim 7, wherein the second interconnect layer is provided between the first interconnect layer and the third interconnect layer.

* * * * *